United States Patent
Takahashi et al.

(10) Patent No.: US 12,094,746 B2
(45) Date of Patent: Sep. 17, 2024

(54) SEMICONDUCTOR MANUFACTURING APPARATUS AND METHOD OF CONTROLLING ROTATION OF STAGE

(71) Applicant: TOKYO ELECTRON LIMITED, Tokyo (JP)

(72) Inventors: Ryotaro Takahashi, Oshu (JP); Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 970 days.

(21) Appl. No.: 16/778,466

(22) Filed: Jan. 31, 2020

(65) Prior Publication Data

US 2020/0251368 A1    Aug. 6, 2020

(30) Foreign Application Priority Data

Feb. 4, 2019  (JP) ................ 2019-018273

(51) Int. Cl.
*H01L 21/68* (2006.01)
*H01L 21/67* (2006.01)
*H01L 21/687* (2006.01)

(52) U.S. Cl.
CPC ........ *H01L 21/68* (2013.01); *H01L 21/67259* (2013.01); *H01L 21/68792* (2013.01)

(58) Field of Classification Search
CPC .............. H01L 21/68; H01L 21/67259; H01L 21/68792; H01L 21/68764; H01L 21/68785

See application file for complete search history.

(56) References Cited

U.S. PATENT DOCUMENTS

2021/0111055 A1*  4/2021  Tamatsukuri ..... H01L 21/68707

FOREIGN PATENT DOCUMENTS

| JP | 2008-270474 A | 11/2008 |
|---|---|---|
| WO | 2019/244982 A1 | 12/2019 |

\* cited by examiner

*Primary Examiner* — Mohammad M Choudhry
(74) *Attorney, Agent, or Firm* — Nath, Goldberg & Meyer; Jerald L. Meyer; Tanya E. Harkins

(57) ABSTRACT

There is provided a semiconductor manufacturing apparatus including: a stage including a shaft provided to a surface opposite a mounting surface on which a substrate is mounted, and configured to be rotated by a driving force of a motor using the shaft as a rotation axis; a storage part storing a correction information on a rotational angle of the stage for each number of rotations in a plurality of rotations of the stage, the plurality of rotations corresponding to a cycle; and a rotation control part configured to control the motor based on the correction information and control the rotation of the stage.

7 Claims, 8 Drawing Sheets

FIG. 1
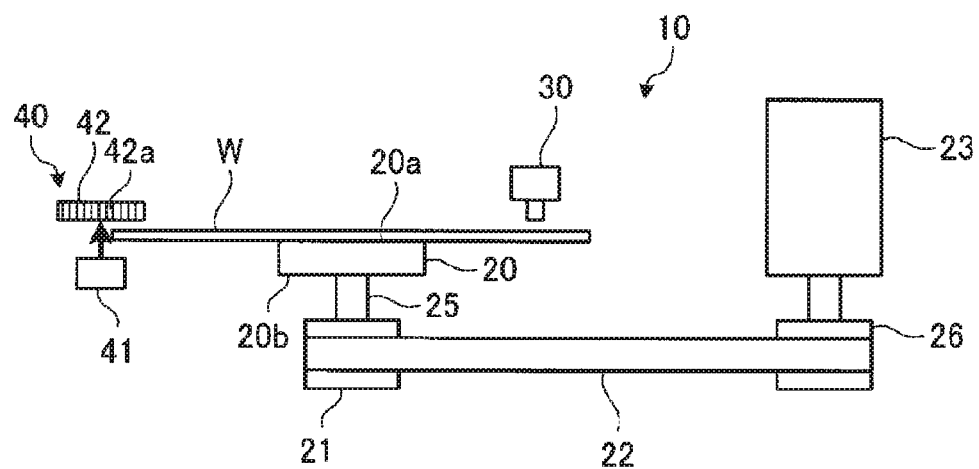
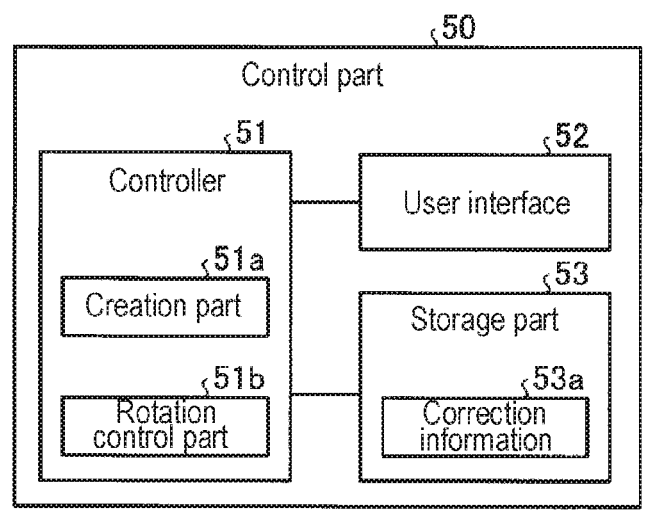

FIG. 6

|  |  | Rotational angle [°] | | | | | |
|---|---|---|---|---|---|---|---|
|  |  | 0 | 1 | 2 | 3 | ... | 359 |
| Number of rotations | 1 | 0.1 | 0.1 | 0.2 | 0.2 | ... | |
|  | 2 | 0.2 | 0.2 | 0.1 | 0.1 | ... | |
|  | 3 | −0.1 | −0.1 | −0.2 | −0.2 | ... | |
|  | ⋮ | ⋮ | ⋮ | ⋮ | ⋮ | ⋱ | |
|  | 49 | | | | | | |

SEMICONDUCTOR MANUFACTURING APPARATUS AND METHOD OF CONTROLLING ROTATION OF STAGE

CROSS-REFERENCE TO RELATED APPLICATION

This application is based upon and claims the benefit of priority from Japanese Patent Application No. 2019-018273, filed on Feb. 4, 2019, the entire contents of which are incorporated herein by reference.

TECHNICAL FIELD

The present disclosure relates to a semiconductor manufacturing apparatus and a method of controlling rotation of a stage.

BACKGROUND

Patent Document 1 discloses a driving mechanism that includes a pulley installed in a rotary shaft of a stage on which a wafer is mounted. The driving mechanism rotates the stage by rotating the pulley using a belt installed on the pulley.

PRIOR ART DOCUMENT

[Patent Documents]
Patent Document 1: Japanese Laid-Open Patent Publication No. 2008-270474

SUMMARY

According to an embodiment of the present disclosure, there is provided a semiconductor manufacturing apparatus including: a stage including a shaft provided to a surface opposite a mounting surface on which a substrate is mounted, and configured to be rotated by a driving force of a motor using the shaft as a rotation axis; a storage part storing a correction information on a rotational angle of the stage for each number of rotations in a plurality of rotations of the stage, the plurality of rotations corresponding to a cycle; and a rotation control part configured to control motor based on the correction information and control the rotation of the stage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a view showing an example of a schematic configuration of an alignment apparatus according to an embodiment.

FIG. 6 is a view schematically showing an example of a data configuration of correction information in accordance with an embodiment.

DETAILED DESCRIPTION

Figure 2:
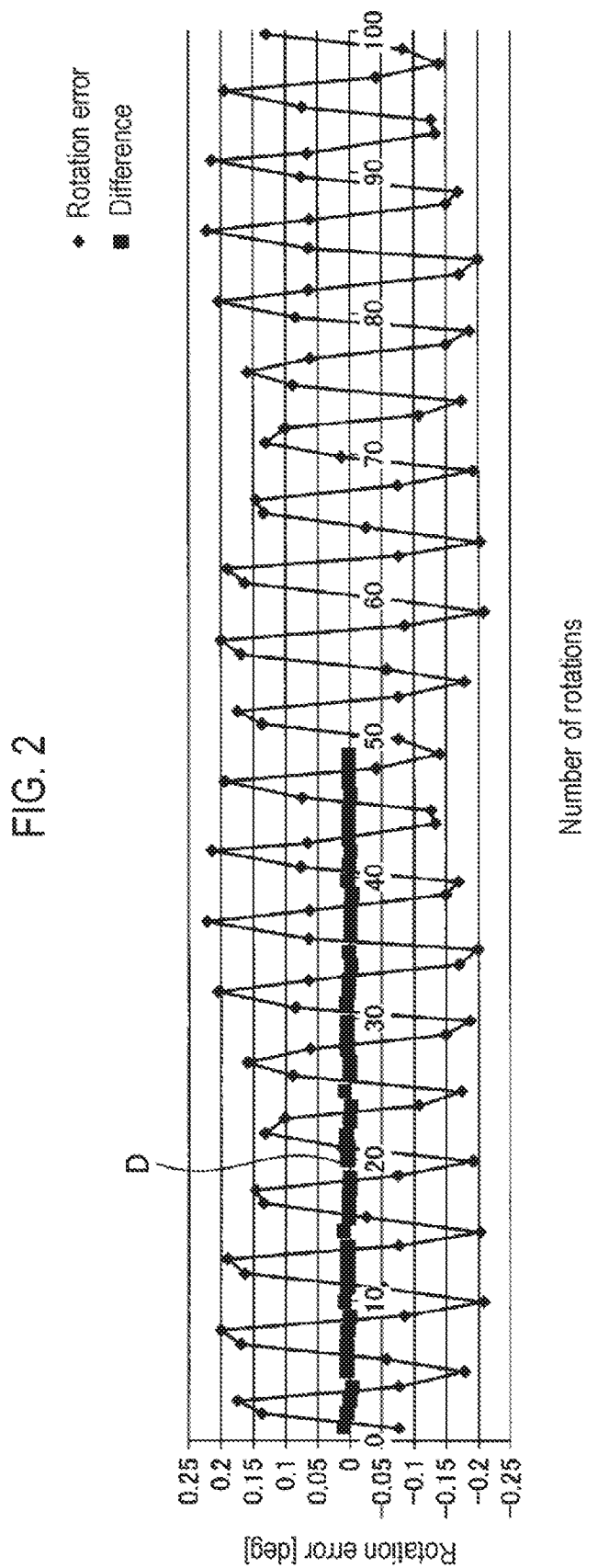
FIG. 2 is a view showing an example of a rotation error for each number of rotations of a stage according to an embodiment.

Hereinafter, embodiments of a semiconductor manufacturing apparatus and a method of controlling rotation of a stage according to the present disclosure will be described in detail with reference to the accompanying drawings. Further, the present disclosure is not limited to the semiconductor manufacturing apparatus and the method described above. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Among semiconductor manufacturing apparatuses, there is a semiconductor manufacturing apparatus having a configuration in which a stage for mounting a semiconductor wafer (hereafter, referred to as "wafer") W thereon is rotatable. An example of such a semiconductor manufacturing apparatus may include an alignment apparatus. For example, in manufacturing of a semiconductor, the wafer W is transferred to an alignment apparatus where the wafer W is subjected to various types of alignment processes such as adjusting a rotational angle of the wafer W. Subsequently, the wafer W is transferred to an apparatus such as an etching apparatus, a film-forming apparatus or the like. The alignment apparatus includes a rotatable stage and performs various types of alignment processes such as adjusting the rotational angle of the wafer W by rotating the stage.

As a driving mechanism for rotating the stage, there is a rotation driving mechanism that includes a pulley installed on a rotary shaft of the stage on which the wafer W is mounted. The rotation driving mechanism rotates the stage by rotating the pulley using a belt installed on the pulley. In such a rotation driving mechanism, if the belt slides on the pulley, the rotational angle of the stage is hard to be controlled. Thus, the rotational angle of the wafer W is less likely to be controlled. Because of this, a toothed pulley and a toothed belt are used in the rotation driving mechanism. However, even if the rotation of the stage is controlled using the toothed pulley and the toothed belt, a rotation error due to low precision may occur in the rotational angle of the stage. Accordingly, a technology that controls the rotational angle of the stage with high precision is expected.

[Configuration of Apparatus]

An example of the configuration of the semiconductor manufacturing apparatus according to an embodiment will be described. In this embodiment, an example in which an alignment apparatus is used as the semiconductor manufacturing apparatus will be described. FIG. 1 is a view showing an example of the configuration of the alignment apparatus according to the embodiment.

An alignment apparatus 10 includes a stage 20, a toothed pulley 21, a toothed belt 22, and a motor 23. The stage 20 is formed in a disc shape and is provided in a horizontal posture. An upper surface of the stage 20 is referred to as a mounting surface 20a on which the wafer W is mounted. A columnar shaft 25 is provided on a rear surface 20b opposite the mounting surface 20a in the stage 20. The stage 20 is configured to be rotatable using the shaft 25 as a rotary shaft.

The toothed pulley 21 is provided to a lower end of the shaft 25. The toothed pulley 21 has a plurality of teeth provided along its circumferential surface. The shaft 25 and the stage 20 are rotated with the rotation of the toothed pulley 21.

The toothed belt 22 extends to engage the toothed pulley 21. The toothed belt 22 is formed in an endless shape which is obtained by connecting a strip-shaped belt in a ring shape. The toothed belt 22 has a plurality of teeth formed on its inner circumferential surface as an inner side of the ring shape. The toothed belt 22 is spanned with the toothed pulley 21 such that the teeth on the inner circumferential surface of the toothed belt 22 are engaged with the teeth of the toothed pulley 21.

The toothed belt 22 is rotated by a driving force of the motor 23. For example, a toothed pulley 26 is provided on a rotary shaft of the motor 23. The toothed pulley 26 has a plurality of teeth formed along its circumferential surface. It is assumed in this embodiment that the toothed pulley 21 and the toothed pulley 26 are identical to each other and a pulley ratio of the toothed pulley 21 and the toothed pulley 26 is 1:1. The toothed belt 22 is spanned with the toothed pulley 26 such that the teeth on the inner circumferential surface of the toothed belt 22 are engaged with the teeth of the toothed pulley 26. Accordingly, as the rotary shaft of the motor 23 rotates, the toothed belt 22 is rotated by the toothed pulley 26 and thus the toothed pulley 21 is rotated. Since the pulley ratio of the toothed pulley 21 and the toothed pulley 26 is 1:1, the toothed pulley 21 is rotated corresponding to every rotation of the toothed pulley 26. As the toothed pulley 21 rotates, the shaft 25 and the stage 20 are also rotated in the circumferential direction. The motor 23 may transmit power to the toothed belt 22 through a power-transmittable part, such as gears.

The operation of the alignment apparatus 10 configured as above is entirely controlled by a control part 50. The control part 50 is, for example, a computer, and includes a controller 51, a user interface 52, and a storage part 53.

The controller 51 includes a central processing unit (CPU) and controls each part of the alignment apparatus 10.

The user interface 52 may be configured by a keyboard from which a process manager inputs commands to manage the alignment apparatus 10, a display that visually shows the operation situation of the alignment apparatus 10, or the like.

The storage part 53 stores various programs such as control programs for implementing various processes which are executed by the alignment apparatus 10 under the control of the controller 51. Furthermore, the storage part 53 stores various data such as process conditions which are used for the programs. For example, correction information 53a is stored in the storage part 53. The various programs or the various data may be stored in a non-transitory computer-readable computer recording medium (e.g., a hard disk, an optical disc such as a DVD, a flexible disc, a semiconductor memory or the like). Further, the various programs or the various data may be stored in other devices, and may be read out and used through a dedicated line in an online environment.

The controller 51 includes an internal memory for storing programs or data, reads out the control programs stored in the storage part 53, and executes processes of the read control programs. The controller 51 functions as various processing parts through the operation of the control programs. For example, the controller 51 has functional parts such as a creation part 51a and a rotation control part 51b. In this embodiment, the case in which the controller 51 functions as various processing parts have been described as an example, but the present disclosure is not limited thereto. For example, the functions of the rotation control part 51b and the creation part 51a may be separately implemented by a plurality of controllers.

The alignment apparatus 10 is configured to detect the number of rotations and the rotational angle of the stage 20. For example, an encoder (not shown) may be provided in the rotary shaft of the motor 23. The encoder outputs pulses to the control part 50 with the rotation of the rotary shaft of the motor 23. The number of pulses which are outputted by the encoder for each rotation of the stage 20 is set to a specific value. For example, in the alignment apparatus 10, assuming that the rotational angle of the stage 20 at a predetermined timing is a valve in an initial state, the rotational angle of the stage 20 in the initial state is set to zero degrees, and the number of rotations of the stage 20 in the initial state is set to zero. The control part 50 can detect the number of rotations and the rotational angle of the stage 20 from the initial state by counting the pulses outputted from the encoder. The predetermined timing may be any timing, and for example, may be a timing when the alignment apparatus 10 is installed or a timing when the creation part 51a creates the correction information 53a (to be described in detail later).

However, in a case in which the alignment apparatus 10 repeats a process of rotating the stage 20 and then positioning the stage 20 at a specific rotational angle, a rotation error may be generated in the rotational angle of the positioned stage 20 for each rotation of the stage 20. Such a rotation error is not constant and is varied each time the stage 20 is rotated. FIG. 2 is a view showing an example of the rotation error generated for certain number of rotations of the stage in accordance with an embodiment. FIG. 2 shows the results of rotation errors detected at a specific rotational angle, which are generated when positioning the stage 20 at specific rotational angles after one rotation of the stage 20. For example, the rotation errors are detected as follows. As shown in FIG. 1, a camera 30 is disposed above the stage 20. A target mark is formed in the upper surface of the wafer W. The wafer W is arranged on the stage 20 such that the target mark faces the camera 30. The alignment apparatus 10 rotates the stage 20 by rotating the motor 23, counts pulses outputted from the encoder included in the motor 23, and ceases the rotation of the motor 23 at every pulse number corresponding to one rotation of the stage 20. That is, the alignment apparatus 10 repeatedly positions the stage 20 at the same rotational angle for each rotation. The alignment apparatus 10 picks up an image of the target mark formed in the wafer W using the camera 30 for each rotation of the stage 20, and detects the rotation errors by obtaining the rotational angle of the stage 20 from the position of the target mark in the picked-up image.

As shown in FIG. 2, even though the alignment apparatus 10 repeatedly performs positioning of the stage at the same rotational angle for each rotation, the rotation error is generated in each rotational angle of the stage 20. The rotation error of the stage 20 changes for each rotation and shows a cyclic tendency. For example, in the example of FIG. 2, the rotation error of the stage 20 has a cycle of 49 rotations. A difference waveform D that corresponds to a difference between waveforms of rotation errors from 1 to 49 rotations and waveforms of rotation errors from 50 to 98 rotations is shown in FIG. 2. The difference waveform D remains close to almost 0. It can be seen from this that the rotation error of the stage 20 has a cycle of 49 rotations in the example of FIG. 2.

It was found that the rotation error of the stage 20 is caused by a manufacturing error of the teeth of the toothed belt used for the rotation driving mechanism configured to rotate the stage 20, Further, it was found that the variation cycle of the rotation error of the stage 20 is obtained from the number of teeth of the toothed pulley and the number of teeth of the toothed belt. When the pulley ratio of the toothed pulley 21 and the toothed pulley 26 is 1:1 as in the embodiment, it was found that the variation cycle of the rotation error of the stage 20 is a value obtained by dividing a least common multiple between the number of teeth of the toothed pulley 21 or the toothed pulley 26 and the number of teeth of the toothed belt 22 by the number of teeth of the toothed pulley 21 or the toothed pulley 26.

Accordingly, the alignment apparatus 10 can correct fluctuation in the rotational angle of the stage 20 only by storing the rotation error in the rotational angle of the stage 20 for each number of rotations just as much as the variation cycle.

To do this, the alignment apparatus 10 according to the embodiment stores the correction information 53*a* related to the rotational angle for each number of rotations in the storage part 53 just as much as the variation cycle. The correction information 53*a* is created by the creation part 51*a*.

The creation of the correction information 53*a* will be now described. The alignment apparatus 10 according to the embodiment includes a detection part 40 that detects a diametrical position of the wafer W mounted on the mounting surface 20*a* of the stage 20. For example, as shown in FIG. 1, the alignment apparatus 10 includes a light source 41 and a line sensor 42 which constitute the detection part 40. The light source 41 and the line sensor 42 are disposed to face each other in the vicinity of an end portion of the wafer W mounted on the mounting surface 20*a* of the stage 20. The light source 41 emits light under the control of the control part 50 and radiates the light toward the line sensor 42. The line sensor 42 include a plurality of sensing parts 42*a* arranged in the diametrical direction of the wafer W to detect the light. The line sensor 42 is disposed such that the light emitted from the light source 41 is partially blocked by the wafer W so as not to reach a portion of the sensing parts 42*a*. The line sensor 42 outputs sense information representing the light detection results of the respective sensing parts 42*a* to the control part 50. The control part 50 detects the diametrical position of the water W based on the sense information. For example, the control part 50 detects a position of the sensing part 42*a* positioned most inward in the diametrical direction of the wafer W, among the sensors 42*a* that have detected the light, as the diametrical position of the wafer W.

Figure 3:
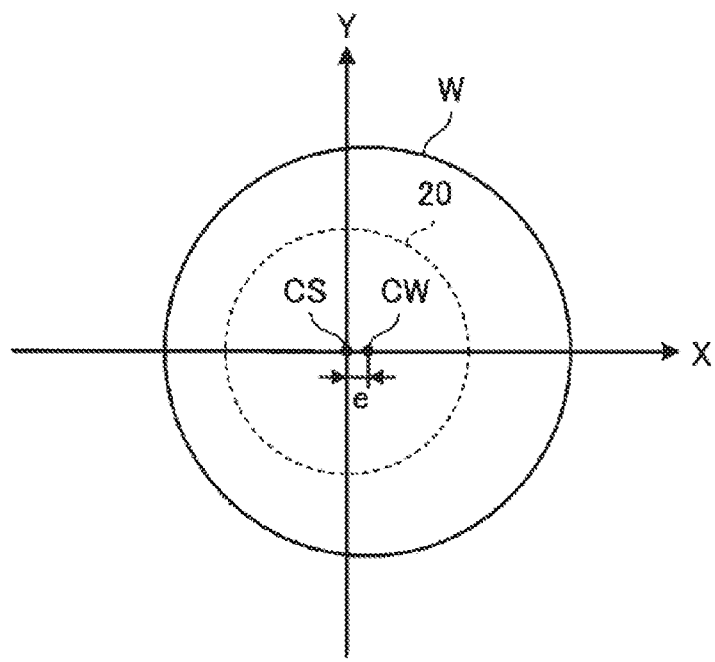
FIG. 3 is a view showing an example of a state in which a wafer is decentered with respect to the stage according to an embodiment.

In the alignment apparatus 10, the wafer W is mounted on the mounting surface 20*a* such that the center of the wafer W is decentered with respect to a rotation axis of the stage 20. For example, the wafer W is mounted on the mounting surface 20*a* such that the center of the wafer W is offset from the rotation axis of the stage 20. The wafer W may be mounted on the stage 20 by a transfer mechanism such as a robot arm or the fingers of a person. FIG. 3 is a view showing an example of a state in which the wafer W is decentered with respect to the stage 20 according to the embodiment. FIG. 3 shows the stage 20 as viewed from the top. The stage 20 has a circular shape. A center CS of the stage 20 corresponds to the rotation axis. In FIG. 3, an X-axis and a Y-axis which are perpendicular to each other are indicated with the center CS of the stage 20 as the origin. The wafer W is arranged such that the center CW of the wafer W is decentered with respect to the center CS of the stage 20 in the X-axis direction. Further, in FIG. 3, for ease of understanding of the decentering of the water W, a decentering amount e of the center CW of the water W decentered from the center CS of the stage 20 is shown as exaggerated, but the decentering amount e may be several millimeters.

The creation part 51*a* detects a variation of the diametrical position of the wafer W using the line sensor 42 by rotating the stage 20 just as much as at least the variation cycle and emitting the light from the light source 41. For example, as shown in FIG. 2, when the variation cycle is 49 rotations, the creation part 51*a* detects the variation of the diametrical position of the wafer W by rotating the stage 20 just as much as at least the 49 rotations, By offsetting the center of the wafer W from the rotation axis of the stage 20, the diametrical position of the wafer W is periodically varied every time the stage 20 is rotated once.

Figure 4:
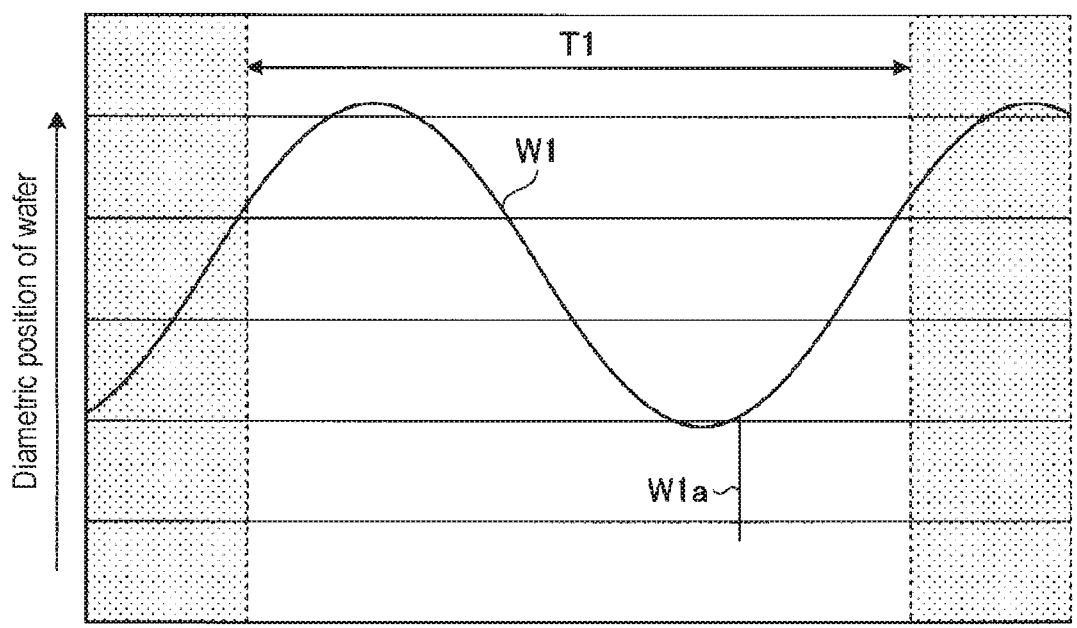
FIG. 4 is a view showing an example of a waveform showing a position change in a diametrical direction in accordance with an embodiment.

FIG. 4 is a view showing an exemplary waveform which represents the variation of the diametrical position of the wafer W in accordance with the embodiment. In FIG. 4, a waveform W1 represents a variation of the diametrical position of the wafer W when the stage 20 is rotated, A portion T1 corresponding to one cycle of the waveform W1 corresponds to the variation of the diametrical position of the wafer W when the stage 20 is rotated once. By decentering the center of the wafer W with respect to the rotation axis of the stage 20. the diametrical position of the wafer W is periodically varied with the rotation of the stage 20. A pulse portion W1*a* where the waveform W1 is changed in a pulse shape is a variation caused by a notch formed in the wafer W. The pulse portion W1*a* may be corrected into a waveform through interpolation at front and back sides of the waveform W1.

The creation part 51*a* obtains a reference waveform to be used in detecting the rotation error of the stage 20. For example, the creation part 51*a* obtains, as the reference waveform, a waveform representing an ideal variation of the diametrical position of the wafer W when there is no rotation error of the stage 20. The waveform representing the ideal variation of the diametrical position of the wafer W when there is no rotation error of the stage 20 becomes a sine wave having an amplitude of the decentering amount at a rotational angle of the wafer W with respect to the rotation axis of the stage 20 in the decentering direction and a rotational angle of the wafer W in a direction opposite the decentering direction. Accordingly, the reference waveform can be obtained from the decentering direction and the decentering amount of the wafer W with respect to the rotation axis of the stage 20. The decentering direction and the decentering amount may be obtained from an actual decentering state when the wafer W is mounted on the stage 20. In some embodiments, the wafer W may be mounted on the stage 20 such that a predetermined decentering direction and a predetermined decentering amount are obtained. Further, the decentering direction and the decentering amount may be obtained from each waveform per one rotation that is detected by rotating the stage 20 just as much as the variation cycle. For example, a rotational angle at which the diametrical position of the wafer W is at its greatest may be obtained from each waveform, and a direction of an average rotational angle of the rotational angles at each of which the diametrical position of the wafer W is at its greatest may be obtained as the decentering direction. In some embodiments, the maximum value and the minimum value of the diametrical position of the wafer W may be obtained from each waveform, and a half of an average value of differences between the maximum values and the minimum values in respective waveforms may be obtained as the decentering amount. The creation part 51a obtains, as the reference waveform, a waveform representing the ideal variation of the diametrical position of the wafer W when there is no rotation error of the stage 20, based on the decentering direction and the decentering amount of the wafer W with respect to the rotation axis of the stage 20. For example, the creation part 51a obtains, as the reference waveform, a sine waveform having a maximum amplitude at a rotational angle of the wafer W in the decentering direction with respect to the rotation axis of the stage 20 and a rotational angle of the wafer W in the direction opposite the decentering direction, and having the maximum amplitude as an decentering amount.

The creation part 51a obtains the rotation error for each number of rotations and creates the correction information 53a by comparing the obtained reference waveform with the waveform representing the variation of the diametrical position of the waver W detected by rotating the stage 20.

Figure 5:
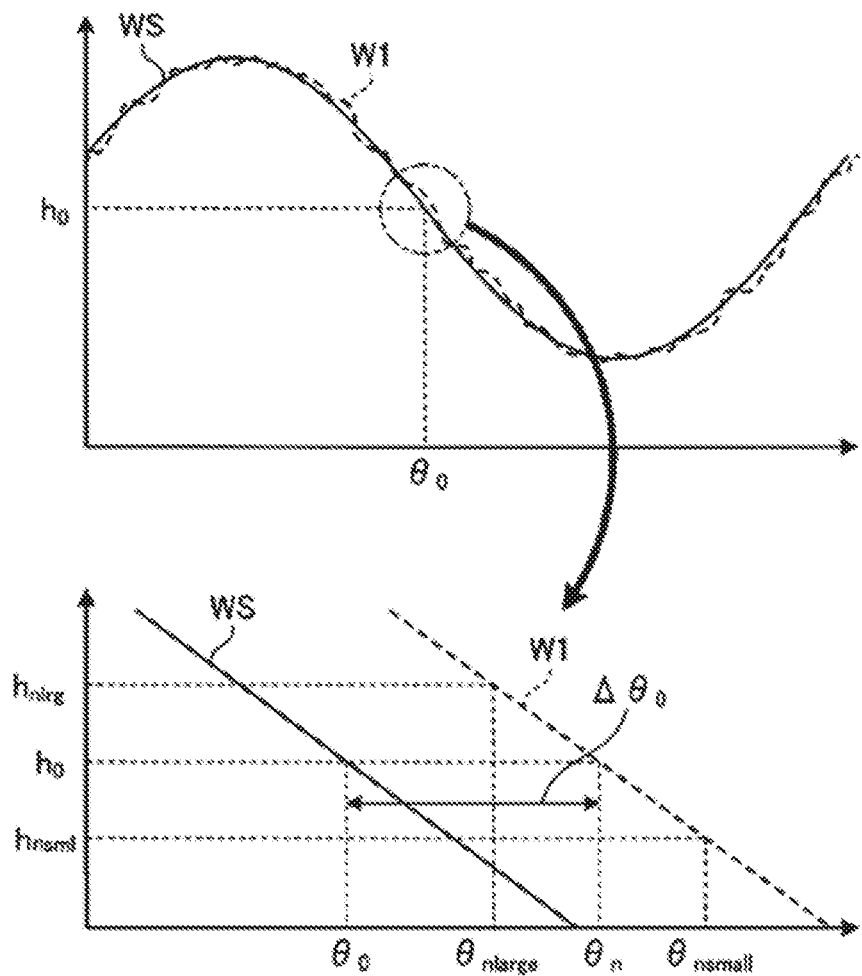
FIG. 5 is a view showing an example of a method of obtaining a rotation error in accordance with an embodiment.

FIG. 5 is a view showing an example of a method of obtaining the rotation error in accordance with an embodiment. In FIG. 5, a reference waveform WS and the waveform W1 representing the variation of the diametrical position of the wafer W detected by rotating the stage 20 are shown. The waveform W1 represents the variation of the diametrical position of the wafer W for one rotation of the stage 20. The reference waveform WS has an amplitude $h_0$ at a rotational angle $\theta_0$. Meanwhile, an amplitude of the waveform W1 at the rotational angle $\theta_0$ is not $h_0$ due to the rotation error, and a rotational angle of the waveform W1 having the amplitude $h_0$ becomes $\theta_n$. Accordingly, a rotation error $\Delta\theta_0$ at the rotational angle $\theta_0$ is obtained as $\theta_n - \theta_0$. When there is no the amplitude $h_0$ data in the detected diametrical position of the wafer W, the rotational angle $\theta_n$ may be obtained as follows. An average of rotational angles of the waveform W1 with respect to amplitudes at both sides of the amplitude $h_0$ may be obtained as the rotational angle of the waveform W1 having the amplitude $h_0$. For example, two consecutive amplitudes are obtained at both sides of the amplitude $h_0$. In another example, an amplitude $h_{nlrg}$ large than the amplitude $h_0$ and an amplitude $h_{nsml}$ smaller than the amplitude $h_0$ are obtained. Rotational angles $\theta_{nlarge}$ and $\theta_{nsmall}$ of the waveform W1 having the amplitude $h_{nlrg}$ and the amplitude $h_{nsml}$ are obtained, respectively. Further, a middle point (average) of the rotational angles $\theta_{nlarge}$ and $\theta_{nsmall}$ may be set to the rotational angle $\theta_n$.

The creation part 51a compares the waveform for each of the detected numbers of rotations with the reference waveform to obtain a rotation error at each rotational angle for each number of rotations, and create the correction information 53a representing the rotation error at each rotational angle for each number of rotations. The creation part 51a stores the correction information 53a thus created in the storage part 53.

FIG. 6 is a view schematically showing an example of a data structure of the correction information in accordance with an embodiment. For example, when the variation cycle is 49 rotations, rotation errors at every rotational angle of 1 degrees for each of 1 to 49 numbers of rotations are stored in the correction information 53a.

Figure 7:
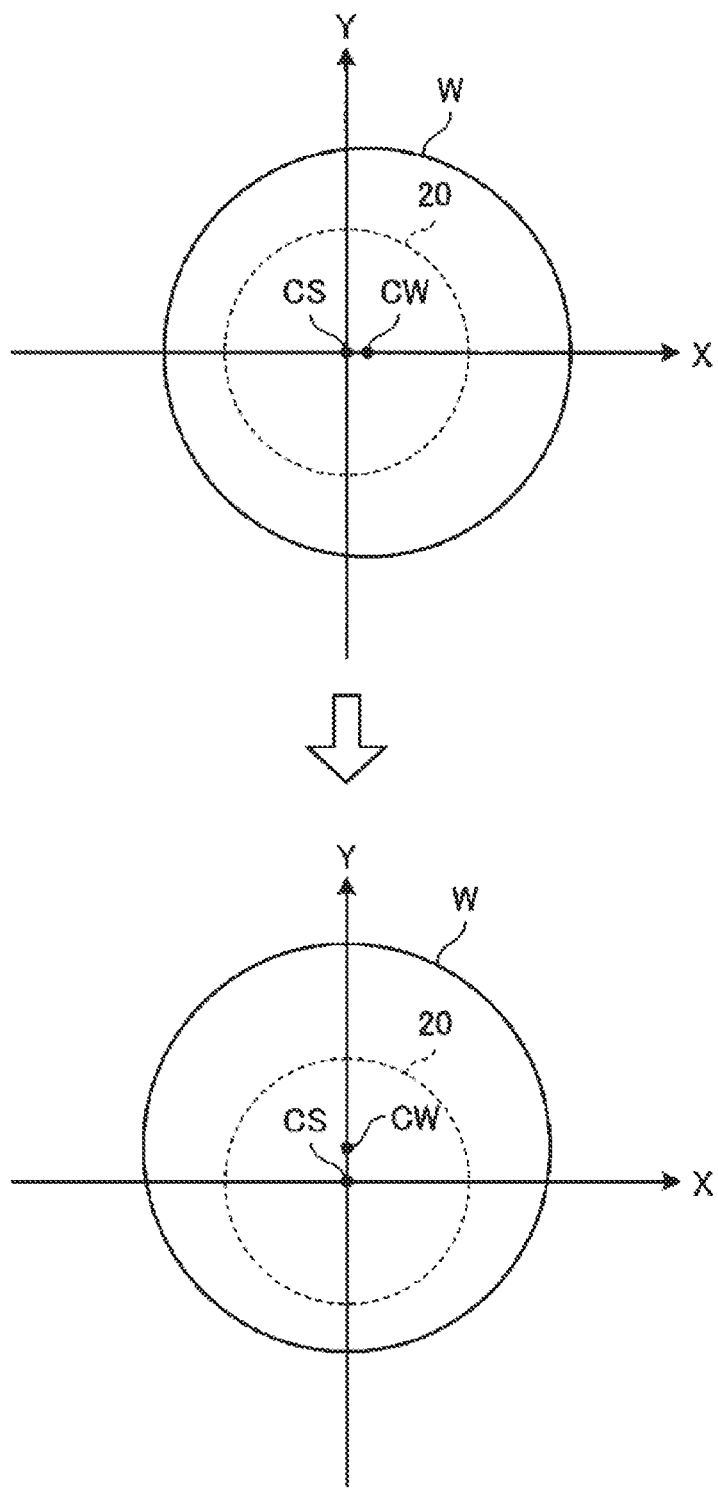
FIG. 7 is a view showing an example of a change in a decentering direction in accordance with an embodiment.

At the rotational angles at peak portions on the reference waveform WS and the waveform W1, rotation errors are hard to be obtained because variations in amplitudes corresponding to variations in the respective rotational angles are small. Accordingly, it is preferable to change the decentering direction of the center of the wafer W with respect to the rotation axis of the stage 20 and detect a rotational angle for each number of rotations in the variation cycle. The decentering direction of the center of the wafer W may be changed within a range of +45 degrees to +135 degrees and a range of −45 degrees to −135 degrees. FIG. 7 is a view showing an example in which the decentering direction is changed, in accordance with an embodiment. The stage 20 has a circular shape and the center CS of the stage 20 corresponds to a rotation axis. For example, first, the alignment apparatus 10 obtains a rotation error at each rotational angle for each number of rotations in the variation cycle in a state where the center CW of the wafer W is decentered with respect to the center CS of the stage 20 in the X-axis direction. Subsequently, the alignment apparatus 10 changes the decentering direction of the center CW of the water to +90 degrees and obtains a rotation error at each rotational angle for each number of rotations in the variation cycle in a state where the center CW of the wafer W is decentered with respect to the center CS of the stage 20 in the Y-axis direction. By changing the decentering direction of the center of the wafer W with respect to the rotation axis of the stage 20 in this manner, the rotational angles at the peak portions on the reference waveform WS and the waveform W1 are varied. Thus, the rotation errors in the entire rotational angle range are likely to be obtained.

The rotation control part 51b controls the motor 23 to rotate the stage 20. The rotation control part 51b counts pulses outputted from the encoder of the motor 23 and detects the number of rotations and rotational angles of the stage based on the number of the counted pulses. The rotation control part 51b controls the rotation of the stage 20 by controlling the motor 23 based on the correction information 53a stored in the storage part 53. For example, in order to control the stage 20 at a specific target rotational angle, the rotation control part 51b specifies which of numbers of rotations in the variation cycle corresponds to the number of rotations of the stage 20. For example, the rotation control part 51b divides the number of rotations of the stage by the variation cycle to obtain a remainder, and specifies a value obtained by adding 1 to the remainder as the number of rotations in the variation cycle. For example, as shown in FIG. 2, when the variation cycle is 49 rotations and the number of rotations of the stage 20 is 100, the number of rotations in the variation cycle is specified as 3. Further, in this embodiment, since the number of rotations in the variation cycle is defined from 1, 1 is added to the remainder. In a case where the number of rotations in the variation cycle is defined from 0, the value of the remainder corresponds to the number of rotations in the variation cycle.

The rotation control part 51b controls the rotational angle of the stage 20 by controlling the motor 23 based on the rotation error stored in the correction information 53a corresponding to the specific number of rotations. For example, the rotation control part 51b reads out a rotation error corresponding to a target rotational angle at the specific number of rotations from the correction information 53a. The rotation control part 51b controls the rotational angle of the stage 20 to a rotational angle obtained by correcting the target rotational angle with the rotation error.

Figure 8A:
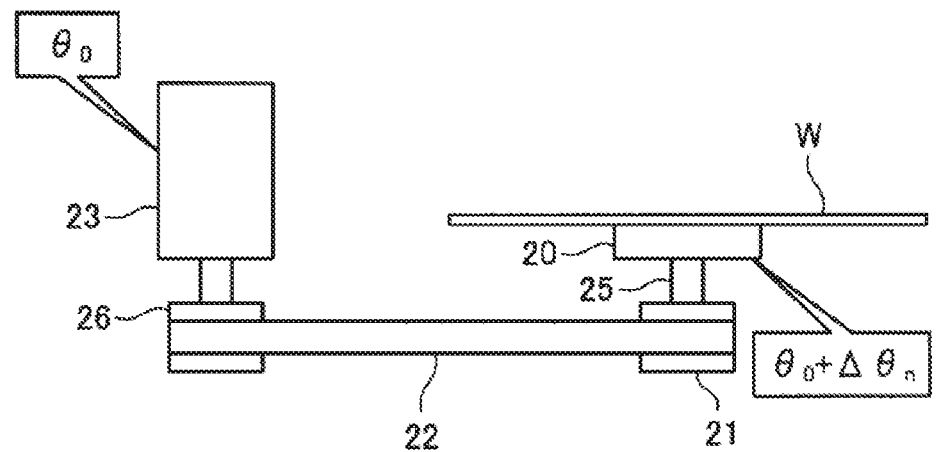
FIGS. 8A and 8B are views showing an example of correction of a rotational angle of the stage in accordance with an embodiment.
Figure 8B:
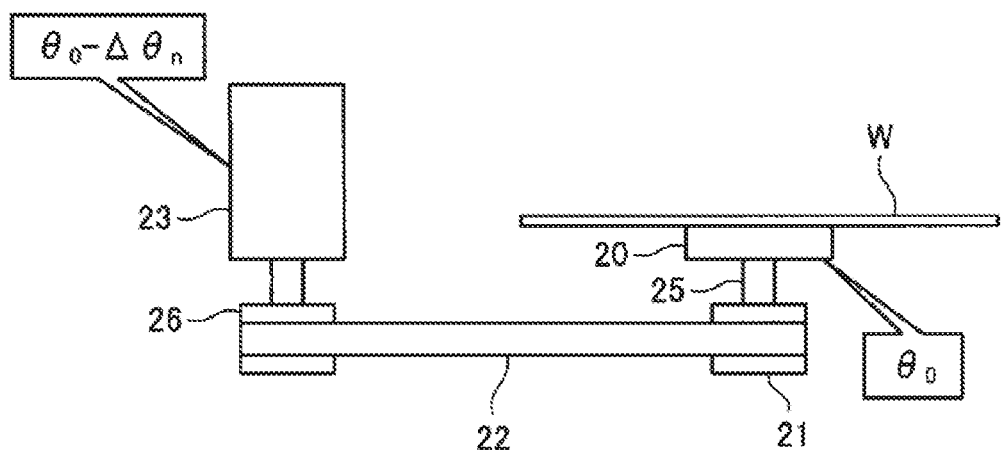

FIGS. 8A and 8B are views showing an example in which the rotational angle of the stage is corrected in accordance with an embodiment. A target rotational angle is referred to as $\theta_0$ in FIG. 8. When the rotation control part 51b controls the rotational angle of the stage 20 to the target rotational angle $\theta_0$, a rotation error is generated the stage 20 according to the number of rotations n in the variation cycle. Thus, as shown in FIG. 8A, the actual rotational angle of the stage 20 becomes $\theta_0+\Delta\theta_n$. Accordingly, the rotation control part 51b corrects the target rotational angle $\theta_0$ with the rotation error $\Delta\theta_n$ and controls the rotational angle of the stage 20 to $\theta_0-\Delta\theta_n$. As a result, as shown in FIG. 8B, the actual rotational angle of the stage 20 becomes the target rotational angle $\theta_0$.

As described above, the alignment apparatus 10 according to this embodiment controls the rotation of the stage 20 by controlling the motor 23 based on the correction information 53a, which makes it possible to control the rotational angle of the stage 20 with high precision.

Figure 9:
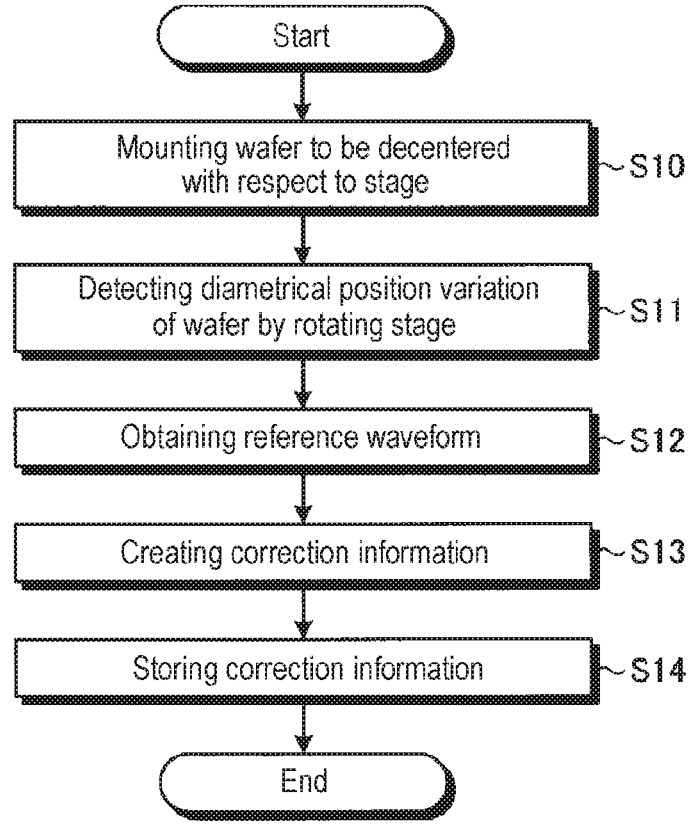
FIG. 9 is a flowchart showing an exemplary flow of a creation process in accordance with an embodiment.

Next, a flow of a process implemented by the alignment apparatus 10 according to the embodiment will be described. First, a flow of a creation process in which the alignment apparatus 10 creates the correction information 53a will be described. FIG. 9 is a flowchart showing an example of the flow of the creation process according to the embodiment. The creation process is carried out at a predetermined timing, for example, a timing at which a predetermined operation that instructs the creation process to be started is performed through the user interface 103.

The wafer W is mounted on the stage 20 such that the wafer W is decentered with respect to the stage 20 (step S10). For example, the wafer W is mounted on the mounting surface 20a such that the center of the wafer W is offset from the rotation axis of the stage 20 using a transfer mechanism such as a robot arm.

The creation part 51a detects a variation of the diametrical position of the wafer W using the line sensor 42 by rotating the stage 20 just as much as at least the variation cycle and emitting light from the light source 41 (step S11). The variation cycle is set in advance. For example, in the alignment apparatus 10 shown in FIG. 1, the variation cycle of the rotation error of the stage 20 is a value obtained by dividing the least common multiple between the number of teeth of the toothed pulley 21 and the number of teeth of the toothed belt 22 by the number of teeth of the toothed pulley 21

The creation part 51a obtains a reference waveform that is used to detect the rotation error of the stage 20 (step S12). For example, the creation part 51a obtains, as the reference waveform, a sine waveform which has a maximum value at a rotational angle of the wafer W with respect to the rotation axis of the stage 20 in the decentering direction and has a minimum value at a rotational angle of the wafer W in a direction opposite the decentering direction, wherein a difference between the maximum value and the minimum value of the waveform is double an decentering amount.

The creation part 51a obtains a rotation error at each rotational angle for each number of rotations by comparing the waveform for each of the detected numbers of rotations with the reference waveform, and creates the correction information 53a storing the rotation error at each rotational angle for each number of rotations (step S13).

The creation part 51a stores the created correction information 53a in the storage part 53 (step S14), and the process ends.

Accordingly, the correction information 53a. which stores the rotation error at each rotational angle for each number of rotations just as much as the variation cycle is stored in the storage part 53.

Figure 10:
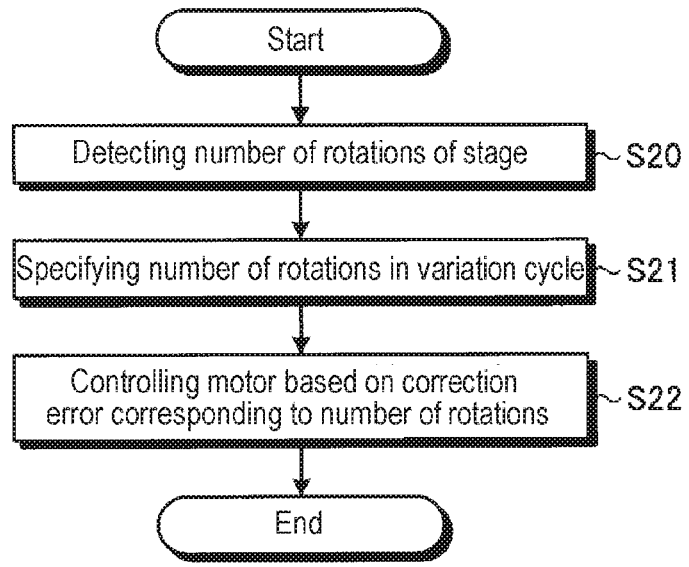
FIG. 10 is a flowchart showing an exemplary flow of a rotation control process in accordance with an embodiment.

Next, a rotation control process in which the alignment apparatus 10 controls the rotation of the stage 20 will be described. FIG. 10 is a flowchart showing an example of the rotation control process in accordance with an embodiment. The rotation control process is carried out to control the stage 20 to be rotated at a specific target rotational angle.

The rotation control part 51b detects the number of rotations of the stage 20 based on the counted number of pulses outputted from the encoder of the motor 23 (step S20).

The rotation control part 51b specifies which number of rotations in the variation cycle of the correction information 53a the detected number of rotations of the stage 20 corresponds to (step S12), The rotation control part 51b controls the rotational angle of the stage 20 by controlling the motor 23 based on the rotation error stored in the correction information 53a corresponding to the specific number of rotations (step 522 d the process ends. For example, the rotation control part 51b reads out a rotation error corresponding to a target rotational angle at the specific number of rotations from the correction information 53a. The rotation control part 51b controls the rotational angle of the stage 20 to a rotational angle obtained by correcting the target rotational angle with the rotation error.

As described above, the alignment apparatus 10 according to the embodiment includes the stage 20, the storage part 53, and the rotation control part 51b. The stage 20 includes the shaft 25 provided to the rear surface opposite to the mounting surface on which the wafer W is mounted. The stage 20 is rotated by a driving force of the motor 23 using the shaft 25 as a rotation axis. The storage part 53 stores the correction information 53a of the rotational angle of the stage 20 for each number of rotations while taking plural rotations of the stage 20 as a cycle. The rotation control part 51b controls the rotation of the stage 20 by controlling the motor 23 based on the correction information 53a. Accordingly, the alignment apparatus 10 according to the embodiment can control the rotational angle of the stage 20 with high precision.

A first toothed pulley (the toothed pulley 21) provided on the shaft 25 and a second toothed pulley (the toothed pulley 26) provided on the rotary shaft of the motor 23 are engaged with the toothed belt 22. The toothed belt 22 is revolved by a driving force of the motor 23, so that the stage 20 is rotated. When the pulley ratio of the first toothed pulley to the second toothed pulley is 1:1, the correction information 53a stores a rotation error of the stage 20 for each number of rotations by taking, as a cycle, the number of rotations corresponding to a value obtained by dividing the least common multiple between the number of teeth of the first toothed pulley or the second toothed pulley and the number of teeth of the toothed belt 22 by the number of teeth of the first toothed pulley or the second toothed pulley. The rotation control part 51b specifies which number of rotations in the cycle the number of rotations of the stage 20 corresponds to. The rotation control part 51b controls the rotational angle of the stage 20 by controlling the motor 23 based on the rotation error stored in the correction information 53a corresponding to the specific number of rotations. Accordingly, the alignment apparatus 10 according to the embodiment can correct rotation errors periodically generated in the stage 20 due to a manufacturing error of the toothed belt 22 with high precision.

The correction information 53a stores the rotation error of the stage 20 at each rotational angle of the stage for each number of rotations. Accordingly, the alignment apparatus 10 according to the embodiment can correct the rotation error of the stage 20, which is generated at every angle of the stage 20 for each number of rotations, with high precision.

The alignment apparatus 10 according to the embodiment includes the detection part 40 and the creation part 51a. The detection part 40 detects the diametrical position of the wafer W mounted on the mounting surface 20a of the stage 20. The wafer W is mounted on the mounting surface 20a such that the center of the wafer W is decentered with respect to the rotation axis of the stage 20. The stage 20 is rotated by at least the cycle (variation cycle) The creation part 51a creates the correction information 53a based on a variation of the diametrical position of the wafer W, which is detected by the detection part 40. Accordingly, the alignment apparatus 10 according to the embodiment can create the correction information 53a of the rotational angle of the stage 20 based on the variation of the diametrical position of the wafer W.

The creation part 51a compares the reference waveform representing a variation of the diametrical position of the wafer W obtained from an decentering amount and an decentering direction of the center of the wafer W with respect to the rotation axis of the stage 20 with a waveform representing a variation of the diametrical position of the water W for each number of rotations detected by rotating the stage 20, obtains a rotation error at the rotational angle of the stage 20 for each number of rotations, and creates the correction information 53a. Accordingly, the alignment apparatus 10 according to the embodiment can create the correction information 53a storing the rotation error at the rotational angle of the stage 20 for each number of rotations.

Although the embodiments of the present disclosure have been described above, it should be noted that the embodiments disclosed herein are exemplary in all respects and are not restrictive. Indeed, the above embodiments may be implemented in various forms. Indeed, the above embodiments may be omitted, replaced or modified in various forms without departing from the scope and spirit of the appended claims.

For example, in an embodiment in which a substrate is used as the wafer W is described, the present disclosure is not limited thereto. Any substrate may be used as the substrate as long as it has a disc shape. For example, other substrates such as a glass substrate may be used as the substrate.

Although in the above embodiment, the example in which the rotation error at each rotational angle of the stage 20 is obtained for each number of rotations, the present disclosure is not limited thereto. For example, in a case where the stage 20 is used to be positioned only at a specific rotational angle, only the rotation error at the specific rotational angle of the stage 20 may be stored in the correction information 53a for each number of rotations. That is, the rotation error at each rotational angle may not be stored in the correction information 53a.

Further, although in the above embodiment, the example in which the pulley ratio of the toothed pulley 21 to the toothed pulley 26 have been described to be 1:1, the present disclosure is not limited thereto. The pulley ratio of the toothed pulley 21 to the toothed pulley 26 may be a ratio other than 1:1. When the pulley ratio of the toothed pulley 21 to the toothed pulley 26 is a ratio other than 1:1, it was found that the variation cycle of the rotation error of the stage 20 is the least common multiple between a value obtained by dividing the least common multiple between the number of teeth of the toothed pulley 26 and the number of teeth of the toothed belt 22 by the number of teeth of the toothed pulley 26, and a value obtained by dividing the least common multiple between the number of teeth of the toothed pulley 21 and the number of teeth of the toothed belt 22 by the number of teeth of the toothed pulley 21. Accordingly, when the pulley ratio of the toothed pulley 21 to the toothed pulley 26 is a ratio other than 1:1, the correction information 53a may store the rotation error of the stage 20 for each number of rotations by taking, as a cycle, the number of rotations, which corresponds to the least common multiple between the value obtained by dividing the least common multiple between the number of teeth of the toothed pulley 26 and the number of teeth of the toothed belt 22 by the number of teeth of the toothed pulley 26. and the value obtained by dividing the least common multiple between the number of teeth of the toothed pulley 21 and the number of teeth of the toothed belt 22 by the number of teeth of the toothed pulley 21. Accordingly, the alignment apparatus 10 according to the embodiment can correct the rotation errors periodically generated in the stage 20 with high precision even if the pulley ratio of the toothed pulley 26 to the toothed pulley 21 is a ratio other than 1:1.

Although in the above embodiment, the example in which the diametrical position of the wafer W is detected using the light source 41 and the light sensor 42 constituting the detection part 40 has been described, the present disclosure is not limited thereto. For example, any configuration may be used as long as it can detect the diametrical position of the water W.

Although in the above embodiment, the example in which the correction information 53a is created by detecting the diametrical position of the wafer W has been described, the present disclosure is not limited thereto. For example, as described above, the correction information 53 may be created from an image obtained by picking up the target mark formed in the upper surface of the wafer W with the camera 30.

Although in the above embodiment, the example in which the rotation errors periodically generated in the stage 20 due to a manufacturing error of the toothed belt 22 are corrected has been described, the present disclosure is not limited thereto. In the alignment apparatus 10, there may be a case where the rotation error of the stage 20 is varied in a cycle of a plurality of rotations of the stage due to any cause. The alignment apparatus 10 can correct the periodically-varying rotation error of the stage with high precision by storing correction information of the rotational angle of the stage 20 for each number of rotations, for the cycle in which the rotation error is varied.

The example in which the alignment apparatus 10 has been described to be used as the semiconductor manufacturing apparatus in the above embodiment, but the present disclosure is not limited thereto. The semiconductor manufacturing apparatus may be any apparatus as long as it can rotate a stage on which a substrate is mounted.

According to the present disclosure in some embodiments, it is possible to control a rotational angle of a stage with high precision.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor manufacturing apparatus comprising:
a stage including a shaft provided to a surface opposite a mounting surface on which a substrate is mounted, and configured to be rotated by a driving force of a motor using the shaft as a rotation axis;
a storage part storing correction information on a rotation error of the stage at each rotational angle of the stage for each number of rotations in a plurality of rotations of the stage, the plurality of rotations corresponding to a cycle; and
a rotation control part configured to control the motor based on the correction information and control the rotation of the stage,
wherein the rotation error is obtained from variation of a diametrical position of the substrate.

2. The semiconductor manufacturing apparatus of claim 1, wherein the stage is rotated by providing a toothed belt to be engaged with a first toothed pulley provided on the shaft and a second toothed pulley provided on a rotary shaft of the motor, and rotating the toothed belt with the driving force of the motor;
when a pulley ratio of the first toothed pulley to the second toothed pulley is 1:1, the storage part stores the correction information on the rotation error of the stage at each rotational angle of the stage for each number of rotations by taking, as the cycle, the number of rotations corresponding to a value obtained by dividing a least common multiple between the number of teeth of the first toothed pulley or the second toothed pulley and the number of teeth of the toothed belt by the number of teeth of the first toothed pulley or the second toothed pulley; and
the rotation control part is configured to specify a number of rotations corresponding to the number of rotations of the stage in the cycle, and control the rotational angle of the stage by controlling the motor based on the rotation error of the stage at each rotational angle of the stage stored as the correction information corresponding to the specific number of rotations.

3. The semiconductor manufacturing apparatus of claim 2, wherein the substrate has a disc shape, and
the semiconductor manufacturing apparatus further comprises:
a detection part configured to detect the diametrical position of the substrate mounted on the mounting surface of the stage; and
a creation part configured to create the correction information based on the variation of the diametrical position of the substrate, which is detected by the detection part, wherein the substrate is mounted on the mounting surface such that a center of the substrate is decentered with respect to the rotation axis of the stage, and the stage is rotated by at least one the cycle.

4. The semiconductor manufacturing apparatus of claim 3, wherein the creation part creates the correction information by comparing a reference waveform representing a variation of the diametrical position of the substrate, which is obtained from an decentering amount and an decentering direction of the center of the substrate with respect to the rotation axis of the stage, with a waveform representing a variation of the diametrical position of the substrate for each number of rotations detected by the detection part while rotating the stage, and obtaining the rotation error at the rotational angle of the stage for each number of rotations.

5. The semiconductor manufacturing apparatus of claim 1, wherein the stage is rotated by providing a toothed belt to be engaged with a first toothed pulley provided on the shaft and a second toothed pulley provided on a rotary shaft of the motor, and revolving the toothed belt with the driving force of the motor;
when a pulley ratio of the first toothed pulley to the second toothed pulley is a ratio other than 1:1, the storing part stores the correction information on the rotation error of the stage at each rotational angle of the stage for each number of rotations by taking, as the cycle, the number of rotations corresponding to a value of a least common multiple between a value obtained by dividing a least common multiple between the number of teeth of the second toothed pulley and the number of teeth of the toothed belt by the number of teeth of the second toothed pulley, and a value obtained by dividing a least common multiple between the number of teeth of the first toothed pulley and the number of teeth of the toothed belt by the number of teeth of the first toothed pulley; and
wherein the rotation control part is configured to specify a number of rotations corresponding to the number of rotations of the stage in the cycle, and control the rotational angle of the stage by controlling the motor based on the rotation error of the stage at each rotational angle of the stage stored as the correction information corresponding to the specific number of rotations.

6. The semiconductor manufacturing apparatus of claim 1, wherein the substrate has a disc shape, and
the semiconductor manufacturing apparatus further comprises:
a detection part configured to detect the diametrical position of the substrate mounted on the mounting surface of the stage; and
a creation part configured to create the correction information based on the variation of the diametrical position of the substrate, which is detected by the detection part, wherein the substrate is mounted on the mounting surface such that a center of the substrate is decentered with respect to the rotation axis of the stage, and the stage is rotated by at least the cycle.

7. A method of controlling a rotation of a stage, the method comprising:
rotating a stage through a driving force of a motor using, as a rotation axis, a shaft provided to a surface opposite a mounting surface on which a disc-shaped substrate is mounted; and
controlling the rotation of the stage by controlling the motor based on correction information on a rotation error of the stage at each rotational angle of the stage for each number of rotations in a plurality of rotations of the stage set as a cycle,
wherein the rotation error is obtained from variation of a diametrical position of the substrate.

* * * * *